United States Patent
Kim et al.

(10) Patent No.: US 8,422,333 B2
(45) Date of Patent: **\*Apr. 16, 2013**

(54) SEMICONDUCTOR MEMORY DEVICE AND ACCESS METHOD THEREOF

(75) Inventors: Dae-Hyun Kim, Hwaseong-si (KR);
Kwang-il Park, Yongin-si (KR);
Kyoung-Ho Kim, Hwaseong-si (KR);
Hyun-Jin Kim, Suwon-si (KR);
Hye-Ran Kim, Gwangmyeong-si (KR)

(73) Assignee: Samsung Electronics Co., Ltd., Suwon-Si, Gyeonggi-Do (KR)

(\*) Notice: Subject to any disclaimer, the term of this patent is extended or adjusted under 35 U.S.C. 154(b) by 0 days.

This patent is subject to a terminal disclaimer.

(21) Appl. No.: 13/360,093

(22) Filed: Jan. 27, 2012

(65) Prior Publication Data

US 2012/0127810 A1 May 24, 2012

Related U.S. Application Data (63) Continuation of application No. 12/385,121, filed on Mar. 31, 2009, now Pat. No. 8,125,847.

(30) Foreign Application Priority Data

Apr. 29, 2008 (KR) .................. 10-2008-0039984

(51) Int. Cl.
*G11C 8/00* (2006.01)
*G11C 8/18* (2006.01)

(52) U.S. Cl.
USPC ........... 365/233.19; 365/189.05; 365/230.03; 365/230.06

(58) Field of Classification Search ............. 365/233.19, 365/189.05, 230.03, 230.06
See application file for complete search history.

(56) References Cited

U.S. PATENT DOCUMENTS

| | | | |
|---|---|---|---|
| 6,055,210 A | 4/2000 | Setogawa | |
| 7,142,469 B2 | 11/2006 | Kim et al. | |
| 8,125,847 B2* | 2/2012 | Kim et al. | 365/233.19 |
| 2002/0114210 A1 | 8/2002 | Uchida et al. | |
| 2003/0123318 A1 | 7/2003 | Nagashima et al. | |
| 2004/0105339 A1 | 6/2004 | Iwahashi et al. | |
| 2007/0171762 A1 | 7/2007 | Chen et al. | |
| 2007/0242518 A1 | 10/2007 | Seidel et al. | |
| 2008/0049529 A1 | 2/2008 | Ohsawa | |

FOREIGN PATENT DOCUMENTS

| | | |
|---|---|---|
| CN | 101013601 | 8/2007 |
| CN | 101055764 | 10/2007 |
| CN | 101136241 | 3/2008 |
| JP | 2000100164 | 4/2000 |
| JP | 2002251883 | 9/2002 |
| JP | 2003223785 | 8/2003 |
| JP | 2004178729 | 6/2004 |

\* cited by examiner

*Primary Examiner* — Toan Le
(74) *Attorney, Agent, or Firm* — F. Chau & Associates, LLC (57) ABSTRACT

Example embodiments provide a semiconductor memory device that may include: a cell array arranged in pluralities of rows and columns; and a sense amplifier conducting writing and reading operations to the cell array in response to writing and reading commands in correspondence with an access time, which may be variable in period. The sense amplifier adjusts pulse widths of write-in and read-out data in accordance with a period of the access time.

24 Claims, 9 Drawing Sheets

SEMICONDUCTOR MEMORY DEVICE AND ACCESS METHOD THEREOF

CROSS-REFERENCE TO RELATED APPLICATIONS

This application is a continuation of U.S. application Ser. No. 12/385,121 filed on Mar. 31, 2009, now U.S. Pat. No. 8,125,847 which claims priority to Korean Patent Application No. 10-2008-0039984 filed on Apr. 29, 2008, in the Korean Intellectual Property Office (KIPO), the disclosures of which are incorporated by reference herein in their entireties.

BACKGROUND

Example embodiments disclosed herein relate to semiconductor memory devices. More particularly, example embodiments disclosed herein relate to a semiconductor memory device that may be capable of improving access performance, and an access method thereof.

Semiconductor memory devices are generally classified into volatile and nonvolatile types. Volatile semiconductor memory devices may operate fast in reading and writing data, but may have a disadvantage of losing data when a power supply is interrupted. The volatile semiconductor memory devices may be divided into dynamic random access memories (hereinafter, referred to as 'DRAMs') and static random access memories (hereinafter, referred to as 'SRAMs'). DRAMs may conduct refresh operations for retaining data stored therein. SRAMs may be able to retain their data even without refresh operations during power supply.

Recently, semiconductor memory devices employed in electronic systems are evolving in operation rate. A synchronous DRAM (hereinafter, referred to as 'SDRAM') may be an example of a typical memory device operating in high frequency of hundreds megahertz (Hz) in sync with an external system clock. In an SDRAM, operations of all commands relevant to reading/writing functions may be designed to be active in sync with an external system clock signal.

SDRAMs may be classified into single data-rate types (hereinafter, referred to as 'SDR-SDRAM') and double data-rate SDRAMs (hereinafter, referred to as 'DDR-SDRAM'). DDR-SDRAMs may be twice as wide as SDR-SDRAMs in data transmission bandwidth. In recent years, new-generation normal DRAMs with faster DDR2 and DDR3 modes have been developed and used.

A generic DRAM may be composed of plural banks. Each bank may include pluralities of memory cells arranged on intersections of rows and columns. Generally, an access operation of DRAM may be carried out in a unit of a group of banks including two or more banks. Bank groups may operate independently as a unit DRAM and may accomplish a high-frequency operation. The access operation of the bank group may be conducted with tCCD (a delay time after applying a column address). For instance, if tCCD is set to two clocks (2tCK), a command for accessing a bank group may be transferred to the DRAM and after 2tCK, a command for accessing the next bank group may be transferred to the DRAM. The command may be input in 2 clock periods. After transferring the command for accessing the bank group, the access operation may be carried out to a selected bank and an input/output data signal (DQ) may be enabled with a pulse of 2 clock pulses. After accessing the selected bank group, the access operation may be carried out on the same bank group or another bank group.

As is mentioned above, DRAMs have become faster in operation in recent years. Thus, DRAMs may be operating in high frequency. Since a clock width may become narrower as an operation frequency increases, tCCD may be shortened. A shorter tCCD may make a pulse width of the input/output data (DQ) narrower. If the same bank group is continuously accessed under this condition, there may be a problem of insufficient margin on the input/output data (DQ) due to jitters and noises.

In order to resolve this problem, tCCD may be fixed to a larger value for a sufficient margin. For example, a tCCD of 2 clock pulses (2tCK) may be modified to correspond with 4 clock pulses (4tCK). But if tCCD is set on 4 clock pulses (4tCK), it may lengthen a delay time for accessing a bank group. For example, if there is an input of commands in the period of 2 clock pulses, it may not be permissible to receive 3 commands during 4 clock pulses. Otherwise, if commands are input in the period of 4 clock pulses, it may not be permissible to receive 2 commands during 4 clock pulses. Moreover, as the DRAM is set to process commands input in the period of 4 clock pulses if tCCD is fixed to 4 clock pulses (4tCK), the DRAM may be unable to process commands input in the period of 2 or 3 clock pulses. As a result, the semiconductor memory device may be degraded in access performance when tCCD is fixed to a large value in a high frequency band.

SUMMARY

Example embodiments are directed to a semiconductor memory device which may be capable of improving access performance.

Example embodiments provide a semiconductor memory device which may include: a cell array arranged in pluralities of rows and columns; and a sense amplifier conducting writing and reading operations to the cell array in response to writing and reading commands in correspondence with an access time, which may be variable in period. The sense amplifier may adjust pulse widths of write-in and read-out data in accordance with a period of the access time.

According to example embodiments, the cell array my comprise pluralities of bank groups each having pluralities of banks. The access time may be a period for accepting the writing and reading commands to the same bank group.

According to example embodiments, a command for accessing another bank group may be input in the period of a second access time and the access time may be longer than the second access time.

Example embodiments provide an operation method of a semiconductor memory device having a cell array, which may comprise: receiving writing and reading commands for the cell array in accordance with an access time, which may be variable in period; and adjusting pulse widths of write-in and read-out data in correspondence with a period of the access time.

Example embodiments also provide a semiconductor memory device which may include: a cell array arranged in pluralities of bank groups each having pluralities of banks; a mode register set storing information of a first access time; a bank decoder selecting the bank by decoding a bank address; a control block receiving a command for accessing the same bank group in accordance with the first access time, which may be variable in period; and a sense amplifier conducting writing and reading operations to the selected bank. The control block may generate a control signal, corresponding to the first access time, in response to the command, the bank address, the decoded bank address, and the first access time information. The sense amplifier may adjust pulse widths of write-in and read-out data to be correspondent with the first access time in response to the control signal.

According to example embodiments, the first access time may become longer as an operation frequency becomes higher.

According to example embodiments, a command for accessing another bank group may be input in the period of a second access time, and the first access time may be longer than or equal to the second access time.

According to example embodiments, if the first access time is twice the second access time, the command for accessing another bank group may be input before receiving the command for accessing the same bank group.

According to example embodiments, the control signal may include writing and reading control signals for the writing and reading operations.

According to example embodiments, the control block may include: a control signal generator generating a pre-control signal in response to the command, the bank address, and the decoded bank address; and a pulse width adjuster generating the control signal, which has a pulse width corresponding to the first access time, in response to the pre-control signal and the first access time information.

According to example embodiments, the control signal generator may include: a command decoder generating decoded commands, corresponding each to the bank groups, in response to the command and the bank address; master signal generators corresponding each to the bank groups and generating master signals in response each to the decoded commands; and bank information generators corresponding each to the banks and generating bank information in response each to the decoded bank address bits. The bank information generator may operate to generate the pre-control signal by combining the bank information with the master signal.

According to example embodiments, the control signal generator may include: a command decoder generating the decoded commands, corresponding each to the banks, in response to the command and the bank address; and master signal generators corresponding to the banks and generating master signals in response each to the decoded commands.

According to example embodiments the master signal may be the pre-control signal.

According to example embodiments, the pulse width adjuster may include: pluralities of flipflops outputting signals in sync with an internal clock; a multiplexer selecting one from the output signals of the flipflops, except a first flipflop, in response to the first access time information; and an SR latch receiving the output signal from the first flipflop through a set node and receiving the output signal through a reset node from the flipflop selected by the multiplexer. The first flipflop may receive the pre-control signal and each flipflop may receive the output signal of the previous flipflop.

According to example embodiments, the output signals of the flipflops but the first flipflop may be delayed from the output signals of the previous flipflops each by one clock period.

According to example embodiments, the SR latch may output the control signal having a pulse width correspondent with the first access time.

According to example embodiments, the sense amplifier may comprise a data pulse adjuster. The data pulse adjuster may regulate a pulse width of the write-in and read-out data to be correspondent with the first access time in response to the control signal.

According to example embodiments, the data pulse adjuster may include: a write-in data pulse adjuster controlling a pulse width of the write-in data to be correspondent with the first access time in response to the writing control signal; and a read-out data pulse adjuster controlling a pulse width of the read-out data to be correspondent with the first access time in response to the reading control signal.

According to example embodiments, the write-in data pulse adjuster may include: an inverter receiving the write-in data from external; a transmission gate activated by the writing control signal; and a latch circuit. The transmission gate may provide the write-in data to the latch circuit from the inverter and the latch circuit may hold the write-in data while the transmission gate is being active.

According to example embodiments, the latch circuit may output the write-in data having a pulse width correspondent with the first access time.

According to example embodiments, the read-out data pulse adjuster may include: an inverter receiving the read-out data from external; a transmission gate activated by the reading control signal; and a latch circuit. The transmission gate may provide the read-out data to the latch circuit from the inverter and the latch circuit may hold the read-out data while the transmission gate is being active.

According to example embodiments, the latch circuit may output the read-out data having a pulse width correspondent with the first access time.

Example embodiments provide an access method of a semiconductor memory device, which may include a cell array arranged in plural bank groups each having plural banks; and a mode register set storing information of a first access time, which may comprise: receiving a command for accessing the same bank group in accordance with the first access time, which may be variable; generating a pre-control signal in response to the command, a bank address, and a decoded bank address; generating a control signal having a pulse width corresponding to the first access time in response to the pre-control signal and the first access time; and adjusting pulse widths of write-in and read-out data to be correspondent with the first access time in response to the control signal.

According to example embodiments the first access time may become longer as an operation frequency become higher, a command for accessing another bank group may be input in the period of a second access time, and the first access time may be longer than or equal to the second access time.

In this embodiment, if the first access time may be twice the second access time, the command for accessing another bank group may be input before receiving the command for accessing the same bank group.

The semiconductor memory device according to example embodiments may be advantageous to improving access performance.

A further understanding of the nature and advantages of example embodiments may be realized by reference to the remaining portions of the specification and the attached drawings.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
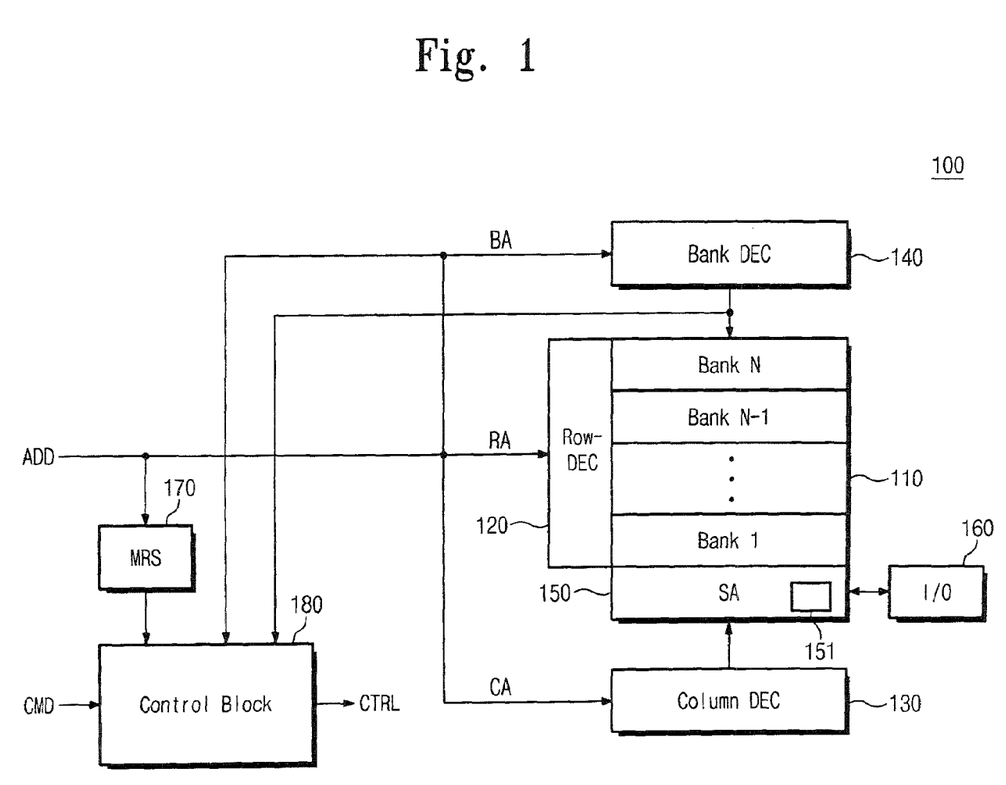
FIG. 1 is a block diagram of a semiconductor memory device according to example embodiments.

FIG. 1 is a block diagram of a semiconductor memory device according to example embodiments.

Referring to FIG. 1, the semiconductor memory device 100 may include a cell array 110, a row decoder 120, a column decoder 130, a bank decoder 140, a sense amplifier 150, an input/output unit 160, a mode register set (MRS) 170, and a control block 180.

The cell array 110 may be composed of pluralities of banks. Each bank may include pluralities of memory cells arranged on intersections of rows and columns. An address ADD may include a bank address BA, a row address RA, and a column address CA. The address ADD may be provided to the MRS 170. The bank address BA may be provided to the bank decoder 140. The row address RA may be provided to the row decoder 120. The column address CA may be provided to the column decoder 130.

The bank decoder 140 may select a bank in response to the bank address BA. The bank decoder 140 may provide a decoded bank address to the control block 180. The row decoder 120 and the column decoder 130 may function to select a location of memory cells in response to an external command and row and column addresses RA and CA. There may be various kinds of commands for instructing row and column access operations in the memory device including, for example, row address strobe (RAS) signal, column address strobe (CAS) signal, write-enable (WE) signal, chip selection (CS) signal, and so on.

The time factor tCCD may be discriminately defined into tCCDL (hereinafter, referred to as 'first access time') for re-accessing the same bank group after accessing a selected bank group, and tCCDS (hereinafter, referred to as 'second access time') for accessing another bank group after accessing a selected bank group. The first access time tCCDL may be longer than or equal to the second access time tCCDS. The first access time tCCDL may be variable according to frequency, while the second access time tCCDS may be fixed on a constant. As an operation frequency becomes higher, the first access time tCCDL may become longer. A command for accessing a bank may be input in the clock period of the first access time tCCDL or the second access time tCCDS. The first access time tCCDL and the second access time tCCDS may be set by a user.

Responding to activation of the RAS signal, the row address RA may be input and decoded by the row decoder 120. If the decoded row address may activate pluralities of memory cells, a small data signal stored in the memory cell may be amplified by an operation of the sense amplifier 150. The sense amplifier 150 may function as a data cache that stands by a reading or writing operation while retaining amplified data.

In the reading operation, the column address CA may be decoded in response to activation of the CAS signal. The sense amplifier 150, as a data cache operating in response to the decoded column address, may provide amplified data to the input/output unit 160. The input/output unit 160 may output data after a predetermined time. According to example embodiments, data may be read out through the sense amplifier 150 from a memory cell selected by the row and column decoders 120 and 130, and the read-out data may be output externally through the input/output unit 160.

In the writing operation, data input through the input/output unit 160 may be stored in memory cells selected by the column and row decoders 200 and 300.

The MRS 170 may include mode registers to store mode data for memory operations. The mode registers will be described in further detail below with respect to FIG. 5. The mode data may be written into the mode registers in response to the address ADD input thereto. The mode data may include first access-time information. The first access-time information may be provided to the control block 180.

The control block 180 may generate a control signal CTRL with a pulse width corresponding to the first access time tCCDL in response to an external command CMD, a bank address BA, a decoded bank address, and the first access-time information. A pulse width of the control signal for access the same bank group may be adjusted to be correspondent with the first access time tCCDL variable by the control block 180. The control signal may be provided to internal circuits for the writing and reading operations.

The sense amplifier 150 may include a data pulse adjuster 151. The data pulse adjuster 151 may accept the control signal CTRL from the control block 180 when the same bank group is being accessed. Responding to the control signal CTRL, the sense amplifier 150 may adjust a written or read data pulse width to be correspondent with the first access time tCCDL that may be variable.

Referring to the aforementioned operation, if the first access time tCCDL varies, the control signal for accessing the same bank group may be adjusted in pulse width to be correspondent with the first access time tCCDL that has varied. Further, a written or read data pulse width may be arranged to be correspondent with the first access time tCCDL, which may be variable.

Thus, although the semiconductor memory device 100 according to example embodiments may receive a command in accordance with the variable first access time tCCDL, the semiconductor memory device 100 may be able to normally access the same bank group. As a result, access performance of the semiconductor memory device 100 may be improved.

Figure 2:
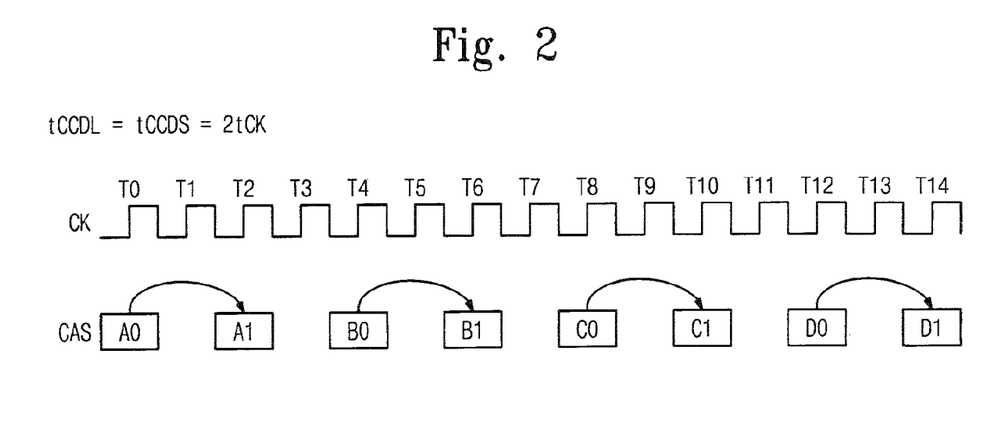
FIGS. 2 through 4 are diagrams showing commands in accordance with a first access time.
Figure 3:
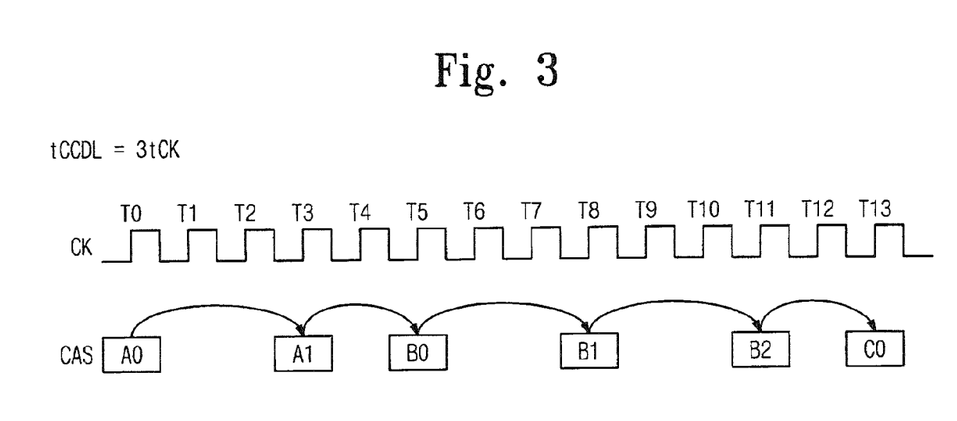
Figure 4:
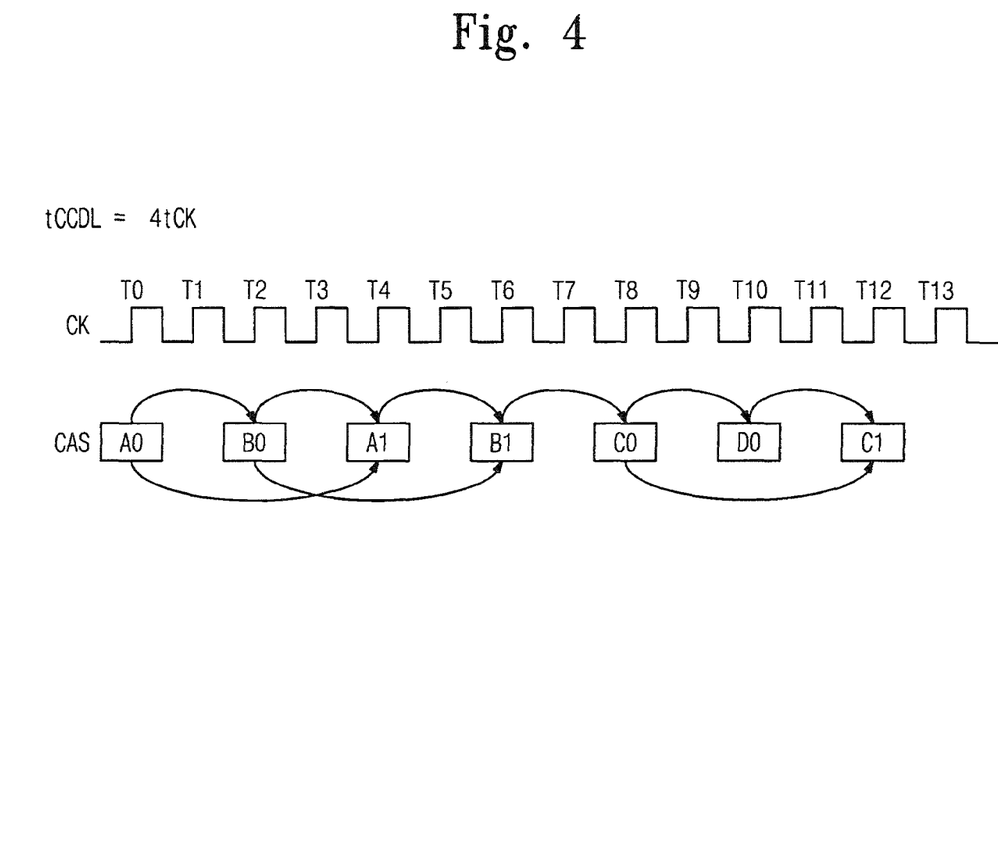

FIGS. 2 through 4 are diagrams showing commands CMD in accordance with the first access time tCCDL.

It will be hereinafter assumed that the cell array 110 may include eight banks A0, A1, B0, B1, C0, C1, D0, and D1; and two banks may compose each of first through fourth bank groups. According to example embodiments; the first bank group may be composed of the banks A0 and A1; the second bank group may be composed of the banks B0 and B1; the third bank group may be composed of the banks C0 and C1; and the fourth bank group may be composed of the banks D0 and D1. The first access time tCCDL may vary between 2 clock pulses (2tCK) through 4 clock pulses (4tCK). The first access time tCCDL may be set to be longer as the operation frequency of the semiconductor device 100 becomes higher. The second access time may be fixed to, for example, two clocks (2tCK). However, example embodiments are not limited to the descriptions provided above and may be arranged in another form by a user. For example, the cell array 110 may include eight bank groups, each of which is composed of two banks, and the first access time tCCDL may be operable in a clock range that is wider than 2 clock pulses (2tCK) through 4 clock pulses (4tCK).

FIG. 2 illustrates a case wherein the first access time tCCDL is 2 clock pulses (2tCK). If the first access time tCCDL is identical to 2 clock pulses (2tCK), a command for accessing the same bank group may be input in the period of 2 clock pulses. FIG. 3 illustrates a case wherein the first access time tCCDL is 3 clock pulses (3tCK). If the first access time tCCDL is identical to 3 clocks (3tCK), a command for accessing the same bank group may be input in the period of 3 clock pulses. FIG. 4 illustrates a case wherein the first access time tCCDL is 4 clock pulses (4tCK). If the first access time tCCDL is identical to 4 clock pulses (4tCK), a command for accessing the same bank group may be input in the period of 4 clock pulses. FIGS. 2 through 4 illustrate the CAS signal.

First referring to FIG. 2, a command for accessing the bank A0 of the first bank group may be input into the semiconductor memory device 100. In compliance with the command input thereto, the semiconductor memory device 100 may begin to access the bank A0 of the first bank group. After 2 clock pulses since the access to the bank A0 of the first bank group, a command for accessing the bank A1 of the same bank group, i.e., of the first bank group, may be input. According to example embodiments, the commands for accessing the same bank group may be input in the period of 2 clock pulses (2tCK).

After 2 clock pulses since the access to the first bank group, a command for accessing the bank B0 of the second bank group may be input. Additionally, the commands for accessing the next bank group may be input in the period of 2 clock pulses.

Alternatively, referring to FIG. 3, a command for accessing the bank A0 of the first bank group may be input into the semiconductor memory device 100. In compliance with the command input thereto, the semiconductor memory device 100 may begin to access the bank A0 of the first bank group. After 3 clock pulses since the access to the bank A0 of the first bank group, a command for accessing the bank A1 of the same bank group, i.e., of the first bank group, may be input. Then, the bank A1 of the first bank group may be accessed. The next command may be for accessing another bank group. The second access time tCCDS may be fixed to 2 clock pulses (2tCK). Accordingly, after 2 clock pulses since the access to the bank A1 of the first bank group, a command for accessing the bank B0 of the second bank group may be input thereto. Thereafter, a command for access to the same bank group may be input in the period of 3 clock pulses (3tCK) and a command for access to another bank group may be input in the period of 2 clock pulses (2tCK).

Referring to FIG. 4, a command for accessing the bank A0 of the first bank group may be input into the semiconductor memory device 100. In compliance with the command input thereto, the semiconductor memory device 100 may begin access to the bank A0 of the first bank group. The first access time tCCDL may be 4 clock pulses (4tCK) and the second access time tCCDS may be 2 clock pulses (2tCK). That is, the first access time tCCDL may be two clocks (2tCK) shorter than the second access time tCCDS. In this case, before a command for access to the bank A1 of the same bank group (i.e., the first bank group) is input thereto, it may be possible to receive a command that is directed to access the bank B0 of the second bank group that is another bank group. If the second access time tCCDS is 2 clock pulses, the command for accessing to the bank B0 of the second bank group may be input in the period of 2 clock pulses.

Afterward, a command for access to the same bank group may be input thereto in the period of 4 clock pulses (4tCK) and a command for access to another bank group may be input in the period of 2 clock pulses (2tCK). Additionally, even before input of the command for access to the same bank group, another command for access to another bank group may be input.

According to example embodiments, an external command for accessing the same bank group may be input to the semiconductor memory device 100 in the period of the first access time tCCDL which may be variable.

Figure 5:
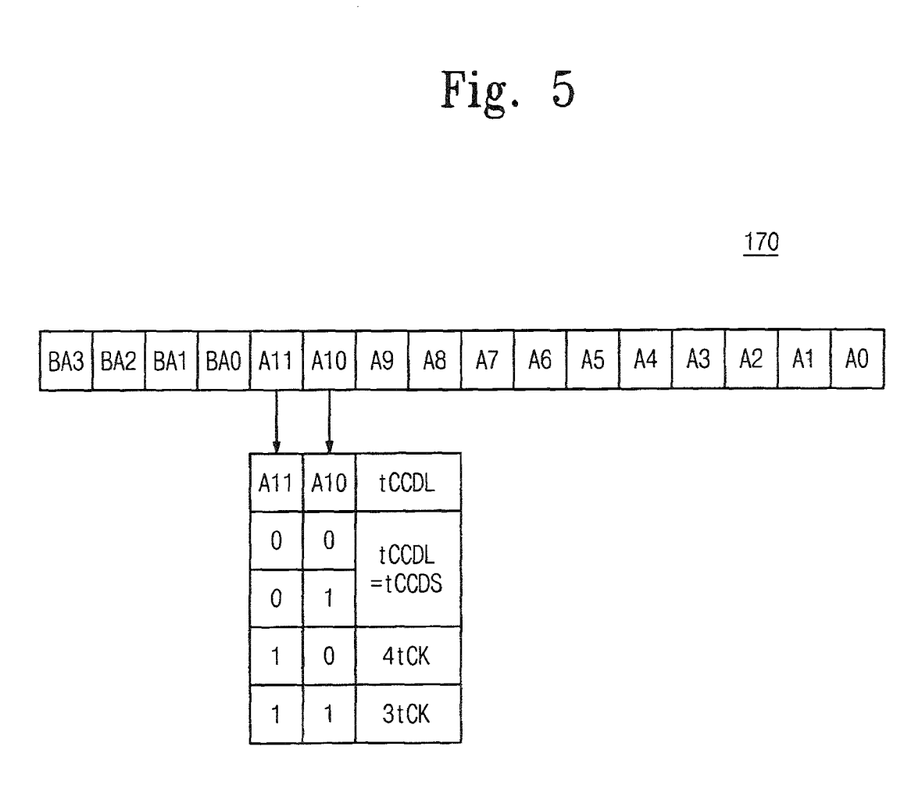
FIG. 5 is a diagram illustrating a configuration of the mode register set shown in FIG. 1.

FIG. 5 is a diagram illustrating a configuration of the MRS 170 shown in FIG. 1.

Referring to FIG. 5, the MRS 170 may include mode registers corresponding to address. The mode registers shown in FIG. 5 may be configured to be correspondent with addresses respectively. The mode registers may be set by users, storing mode data for memory operations. For example, the mode register corresponding to addresses A0 and A1 may be set to values for conducting a refresh mode.

As is illustrated in FIG. 5, the mode register corresponding to address bits A11 and A10 (i.e., [A11:A10]) may store information relating to an access time for accessing the same bank group. As is illustrated in FIG. 5, if the mode data stored in the mode register corresponding to the address [A11:A10] is '00' or '01', the first access time tCCDL may equal to the second access time tCCDS. If the second access time tCCDS is fixed to 2 clock pulses (2tCK), the first access time tCCDL may operate in the period of 2 clock pulses (2tCK). In this case, an external command for accessing the same bank group may be input into the semiconductor memory device 100 in the period of 2 clock pulses (2tCK) as shown in FIG. 2.

If the mode data stored in the mode register corresponding to the address [A11:A10] is '10', the first access time tCCDL may be 4 clock pulses (4tCK). In this case, an external command for accessing the same bank group may be input into the semiconductor memory device 100 in the period of 4 clock pulses (4tCK) as shown in FIG. 4. Also as is mentioned above, a command for accessing another bank group may be input in the period of 2 clock pulses (2tCK) before input of a command for access to the same bank group.

If the mode data stored in the mode register corresponding to the address [A11:A10] is '11', the first access time tCCDL may be 3 clock pulses (3tCK). According to example embodiments, an external command for accessing the same bank group may be input into the semiconductor memory device 100 in the period of 3 clock pulses (3tCK).

The mode data stored in the mode register corresponding to the address [A11:A10] may be set in different forms. The mode data stored in the mode register corresponding to the address [A11:A10] may be provided to the control block 180.

Figure 6:
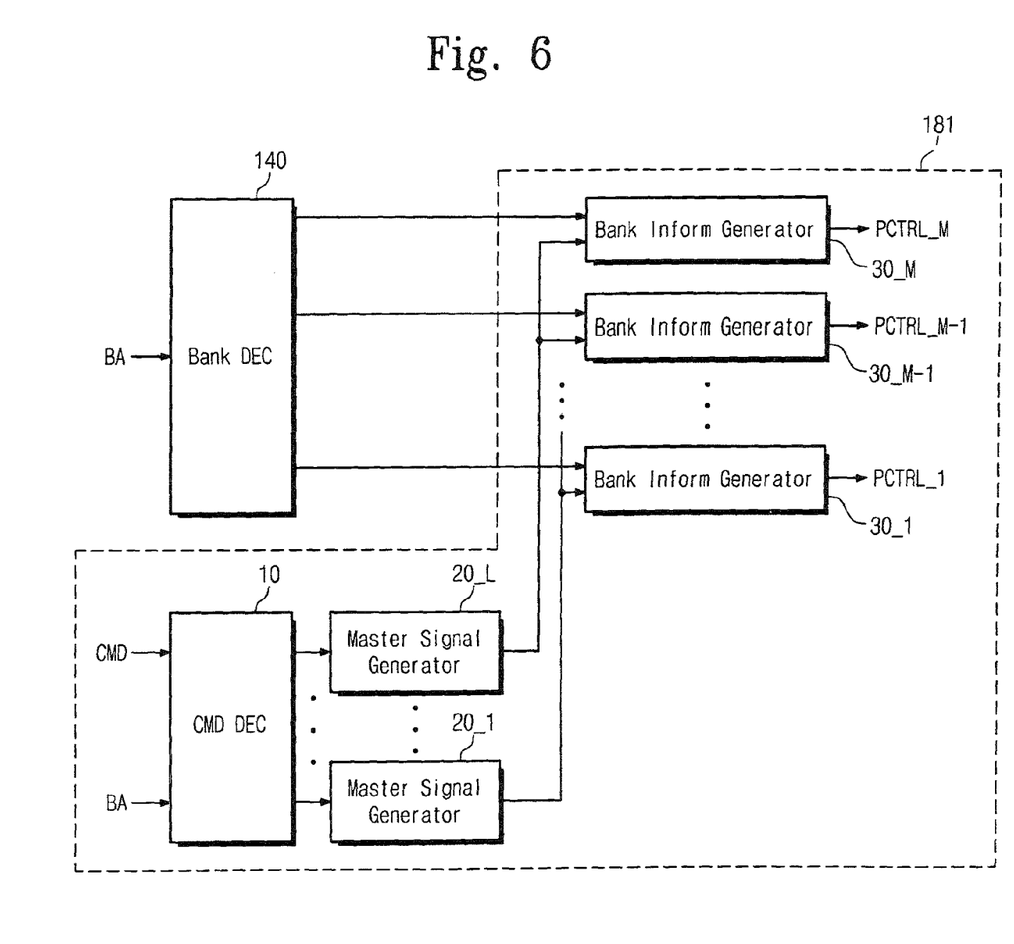
FIGS. 6 and 7 are block diagrams illustrating an organization of the control signal generator shown in FIG. 1.
Figure 7:
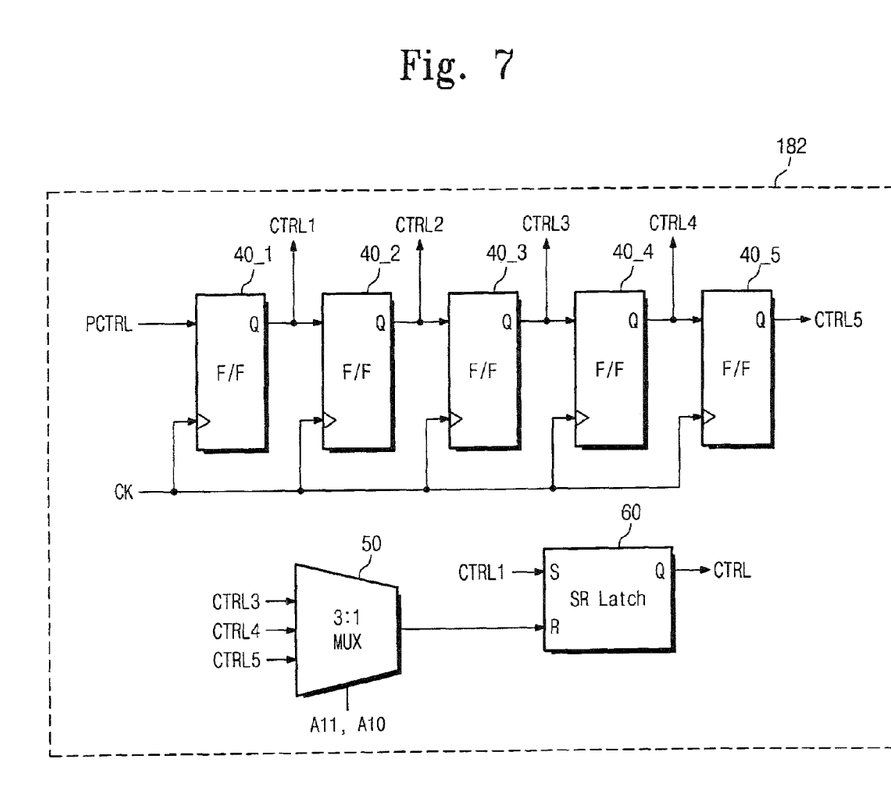

FIGS. 6 and 7 are block diagrams illustrating an organization of the control block 180 shown in FIG. 1.

Referring to FIGS. 6 and 7, the control block 180 may include a control signal generator 181 shown in FIG. 6 and a pulse width adjuster 182 shown in FIG. 7.

As is illustrated in FIG. 6, the control signal generator 181 may comprise a command decoder 10, master signal generators 20_1~20_L, and bank information generators 30_1~30_M, where L and M may each be any natural number. The master signal generators 20_1~20_L may correspond with bank groups, respectively, and with the bank information generators 30_1~30_M as well. As, in the example illustrated in FIG. 6, it may be assumed that the cell array 110 is organized so that first through fourth bank groups each include two banks, the master signal generators 20_1~20_L may be arranged by corresponding to the first through forth bank groups, respectively, i.e., four members 20_1~20_4. The bank information generators 30_1~30_M may be arranged by corresponding each to the eight banks, so they are formed of eight members (e.g., 30_1~30_8).

As is illustrated in FIG. 7, the pulse width adjuster 182 may be organized of flipflops 40_1~40_5, a 3-input multiplexer 50, and an SR latch 60. The organization of the pulse width adjuster 182 illustrated in FIG. 7 may correspond to the case wherein the first access time tCCDL may vary in period from 2 clock pulses to 4 clock pulses.

Hereinafter, operations of the control signal generator 181 and the pulse width adjuster 182 will be described with reference to an example arrangement in which there are four master signal generators 20_1~20_4, four bank groups, and eight bank information generators 30_1~30_8. However, example embodiments are not limited to this arrangement and may include any number of master signal generators, bank groups, and information generators.

The control signal generator 181 may operate to generate pre-control signals PCTRL in response to the external command CMD, the bank address BA, and the decoded bank address. The pre-control signal PCTRL may be provided to the pulse width adjuster 182. The pulse width adjuster 182 may generate the control signals CTRL, each of which may have a pulse width corresponding to the first access time tCCDL, which may be variable, in response to the pre-control signal PCTRL and information of the first access time.

The command decoder 10 of the control signal generator 181 may function to decode the external command CMD. And, the command decoder 10 may provide the master signal generators 20_1~20_4 with the decoded commands corresponding each to the bank groups in response to the bank address BA. The decoded commands may be applied to the first through master signal generators 20_1~20_4 in correspondence with the first through fourth bank groups respectively. For example, if a command input thereto is for accessing the first bank group, the command decoder 10 may provide a decoded command to the first master signal generator 201, which may correspond to the first bank group, in response to the bank address. In addition, the command decoder 10 may provide an inactive decoded command each to the second through fourth master signal generators 20_2~20_4, which may correspond to the second through fourth bank groups, in response to the bank address BA.

The first through fourth master signal generators 20_1 through 20_4 may generate master signals in correspondence with the first through fourth bank groups, respectively. The master signals may be provided for controlling access to the first through fourth bank groups respective thereto. According to the aforementioned condition, the first master signal generator 20_1 may function to generate the master signal with activation.

As the bank information generators 30_1~30_8 may be arranged to be correspondent with the banks in number, the bank information generators 30_1~30_8 may be allocated in groups of two to the first through fourth bank groups, respectively. According to example embodiments, the first and second bank information generators 30_1 and 30_2 may correspond to the first bank group. The third and fourth bank information generators 30_3 and 30_4 may correspond to the second bank group. The fifth and sixth bank information generators 30_5 and 30_6 may correspond to the third bank group. The seventh and eighth bank information generators 30_7 and 30_8 may correspond to the fourth bank group. Thus, the master signal of the first master signal generator 20_1 may be applied to the first and second bank information generators 30_1 and 30_2. The master signals of the second through fourth master signal generators 20_2~20_4 may be applied each to the third through eight bank information generators 30_3~30_8.

The bank information generators 30_1~30_8 may receive the decoded bank address from the bank decoder 140. Since the cell array 110 may be composed of eight banks, the decoded bank address may be 8 bits which may each be provided to corresponding bank information generators

30_1~30_8. The bank information generators 30_1~30_8 may operate to generate bank information in response each to their decoded bank address bits. The bank information may indicate which bank will be accessed. Further, the bank information generators 30_1~30_8 may combine the bank information with the master signals which may be provided from the master signal generators 20_1~20_4, and generate the pre-control signals for accessing selected banks.

As an example, if the memory device is provided with an address and command for accessing the first bank of the first bank group, the first and second bank information generators 30_1 and 30_2 may receive the master signal from the first master signal generator 20_1. Further, a bit provided to the first bank information generator 30_1, among the decoded bank address bits, may be conditioned in an active state. Under this condition, the first bank information generator 30_1 may generate an active pre-control signal (e.g., PCTRL_1), while the second through eight bank information generators 30_2~30_8 may generate inactive pre-control signals (e.g., PCTRL_2~PCTRL_8). The active pre-control signal PCTRL_1 may be applied to the pulse width adjuster 182.

A first flipflop 40_1 of the pulse width adjuster 182 may synchronize the pre-control signal PCTRL (e.g., PCTRL_1), which may be provided from the control signal generator 181, with an internal clock CK. An output signal from the first flipflop 40_1 may act as a first control signal CTRL1, which may be applied to a set node S of the SR latch 60.

A second flipflop 40_2 may synchronize an output of the first flipflop 40_1 with the internal clock CK. An output of the second flipflop 40_2 may be a second control signal CTRL2 that may be delayed from the output of the first flipflop 40_1 by one clock period. This operation may progress up to a fifth flipflop 40_5. Thereby, the second through fifth flipflops 40_2 through 40_5 may output second through fifth control signals CTRL2~CTRL5 which may be delayed each from their prior outputs by one clock period. The third through fifth control signals CTRL2~CTRL5 may be provided to the 3-input multiplexer 50.

The 3-input multiplexer (3:1 MUX) 50 may select one of the third through fifth control signals CTRL3~CTRL5 in accordance with the first access-time information provided from the mode register corresponding to the address A11 and A10. For example, the 3-input multiplexer 50 may select the third control signal CTRL3 when the mode data of the mode register corresponding to the address [A11:A10] is '00' or '01'; the 3-input multiplexer 50 may select the fifth control signal CTRL5 when the mode data of the mode register corresponding to the address [A11:A10] is '10; and the 3-input multiplexer 50 may select the fourth control signal CTRL4 when the mode data of the mode register corresponding to the address [A11:A10] is '11'. The selected control signal CTRL may be applied to a reset node R of the SR latch 60.

The SR latch 60 may set its output signal in response to the first control signal CTRL1 and reset its output signal in response to the selected control signal CTRL provided from the 3-input multiplexer 50. For instance, if the first access time tCCDL is 4 clock pulses (4tCK), the SR latch 60 may set its output signal in response to the first control signal CTRL1 and reset its output signal in response to the fifth control signal CTRL5. Thus, the SR latch 60 may generate its output signal that has a pulse width corresponding to a length of 4 clock pulses (hereinafter, referred to as '4-clock pulse width'). The output of the SR latch 60 may act as the control signal CTRL for an access operation.

If the first access time tCCDL is 2 clock pulses (2tCK), the 3-input multiplexer 50 may select the third control signal CTRL3. The control signal CTRL output from the SR latch 60 may have a pulse width corresponding to a length of 2 clock pulses (hereinafter, referred to as '2-clock pulse width'). If the first access time tCCDL is 3 clock pulses (3tCK), the 3-input multiplexer 50 may select the fourth control signal CTRL4. The control signal CTRL output from the SR latch 60 may have a pulse width corresponding to a length of 3 clock pulses (hereinafter, referred to as '3-clock pulse width').

In summary, if the first access time tCCDL varies in period, a pulse width of the control signal for accessing the same bank group may be adjusted to be correspondent with the first access time tCCDL, which may be variable.

The aforementioned operation explained with reference to FIG. 7 relates to adjustment of the control signal, which may be set to have the 2-clock pulse width, to the 3 or 4-clock pulse width when the first access time tCCDL varies to 3 or 4 clock pulses. However, according to example embodiments, the pulse width adjuster 182 may include a functional organization similar to that of FIG. 7 and may be configured to adjust a control signal, which is set to have a 1-clock pulse width, to have the 2 or 3-clock pulse width.

Figure 8:
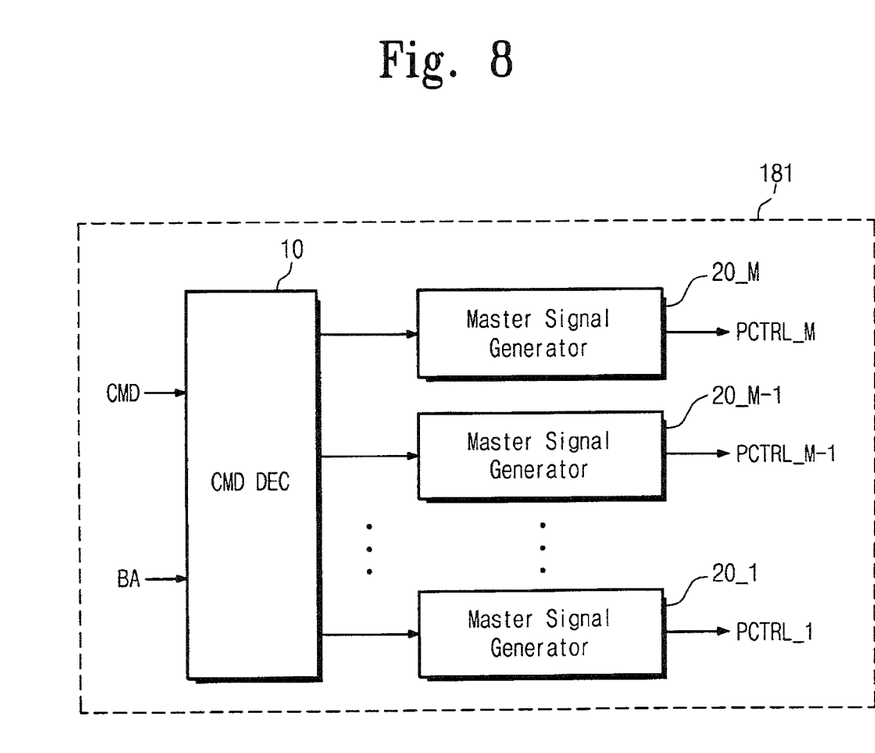
FIG. 8 is a block diagram showing another organization of the control signal generator.

FIG. 8 is a block diagram showing another organization of the control block 180.

Referring to FIG. 8, the control signal generator 181 of the control block 180 may include the command decoder 10 and the master signal generators 20_1~20_M. The master signal generators 20_1~20_M may be arranged in correspondence with banks respectively. As the cell array 110 may be composed of eight banks, it may be assumed that, in the example illustrated in FIG. 8 the control signal generator 181 of the control block 180 may include eight master signal generators 20_1~20_8. According to example embodiments, the pulse width adjuster 182 of the control block 180 may be the same as that shown in FIG. 7, so it will not be further described.

The command decoder 10 may provide the master signal generators 20_1~20_8 each with decoded commands, which may correspond to the banks, in response to the bank address BA. The decoded commands corresponding to the first through eighth banks may be applied to the first through eighth master signal generators 20_1~20_8. For example, if a command is input for accessing the first bank, the command decoder 10 may provide an active decoded command to the first master signal generator 20_1, which may correspond to the first bank, in response to the bank address BA. The command decoder 10 may provide an inactive decoded command to the second through eighth master signal generators 20_2~20_8, which may correspond to the second through eighth banks, in response to the bank address BA.

According to example embodiments, the first master signal generator 20_1 may operate to generate an active master signal, which may be for accessing the first bank, in response to the decoded command input thereto. The first master signal generated may be the pre-control signal PCTRL_1. The second through eighth master signal generators 20_2~20_8 may operate to generate inactive master signals in response to the decoded commands input thereto. The active master signal may be provided to the pulse width adjuster 182. An operation of the pulse width adjuster 182 may be as same as is mentioned with respect to FIG. 7.

It will be understood by those skilled in the art that the control signal generator 181 may be formed differently in accordance with a configuration pattern. For example, if the cell array 110 is composed of eight bank groups each of which has two banks, the master signal generators and the bank information generators shown in FIG. 6 may be arranged to be 8 and 16 in number, respectively; and the master signal generators shown in FIG. 8 may be arranged to be 16 in number.

The pulse width adjuster 182 may be configured in a different form. For example, if the first access time tCCDL varies to 2 clock pulses (2tCK) and 3 clock pulses (3tCK), the flipflops shown in FIG. 7 are arranged in number of 4 and the multiplexer is configured with two inputs (i.e., 2-input multiplexer).

Figure 9:
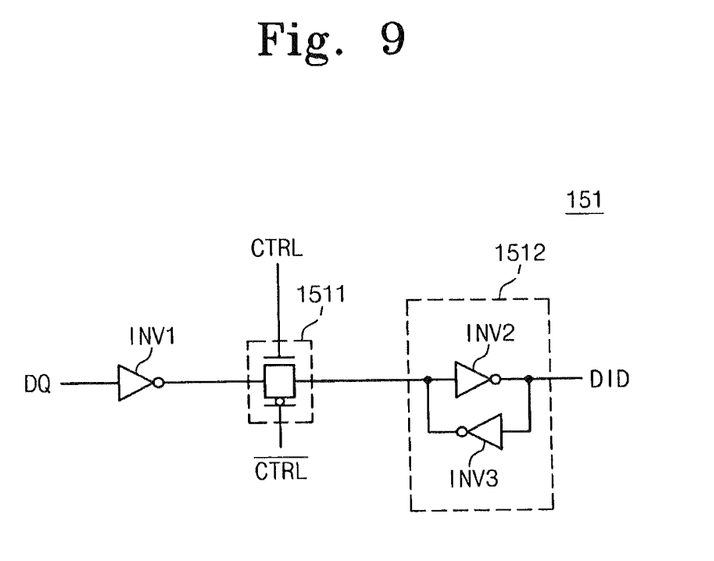
FIG. 9 is a block diagram illustrating an organization of the data pulse adjuster shown in FIG. 1.

FIG. 9 is a block diagram illustrating an organization of the data pulse adjuster 151 shown in FIG. 1.

The data pulse adjuster 151 may be classified in two kinds of circuits, both of which may have the structure illustrated in FIG. 9: one may be for adjusting a pulse width of data to be written (i.e., writing-data pulse adjuster); and the other may be for adjusting a pulse width of data to be read (i.e., reading-data pulse adjuster). Hereinafter, the data pulse adjuster 151 shown in FIG. 9 may be regarded as the writing-data pulse adjuster, as an example, and the data pulse adjuster 151 will be described with respect to a writing operation thereof. The reading-data pulse adjuster may be configured in the same structure practically with the writing-data pulse adjuster.

The least value of the first access time tCCDL, which may be variable, may be identical to the second access time tCCDS. With reference to this condition, the least value of the first access time tCCDL may be 2 clock pulses (2tCK). Thus, in the writing or reading operation, data input or output through the input/output unit 160 may have a pulse width of 2 clock pulses. But, since the first access time tCCDL may be variable, the data pulse width may be adjusted as like the control signal CTRL when the same bank group is accessed.

Referring to FIG. 9, the data pulse adjuster 151 may be comprised of an inverter INV1, a transmission gate 1511, and a latch circuit 1512.

In the writing operation, data (or write-in data) DQ input through the input/output unit 160 may have a clock pulse width of 2. If the first access time tCCDL is 4 clock pulses, the control signal CTRL output from the control block 180 may be adjusted to have a clock pulse width of 4. The control signal of a clock pulse width of 4 may be provided to the transmission gate 1511. The control signal CTRL applied to the transmission gate 1511 during the writing operation may operate to control the writing operation.

The transmission gate 1511 may changes to an on-state according to the control signal CTRL. As the transmission gate 1511 is turned on, the input data DQ may be held in the latch circuit 1512. Since the transmission gate 1511 may maintain its on-state for the period of 4 clock pulses by the control signal CTRL, the write-in data DID output from the latch circuit 1512 may have a clock pulse width of 4. Thus, during the writing operation, data written into the memory cell may be adjusted to have the clock pulse width of 4. Similarly, if the control signal is a clock pulse width of 3, write-in data may be adjusted to have the clock pulse width of 3 by means of the data pulse adjuster 151.

In the reading operation, data may be read out from a memory cell. Read-out data may have a clock pulse width of 4 by means of the data pulse adjuster in a manner similar to that of the data pulse adjuster 151 mentioned above. During the reading operation, the control signal CTRL provided to the data pulse adjuster may operate to control the reading operation. Read-out data may be provided to the input/output unit 160 and output with adjustment to a clock pulse width of 2 by the input/output unit 160.

According to example embodiments, the data pulse adjuster 151 may modify write-in or read-out data to have a pulse width corresponding to the first access time tCCDL, which is variable, when the same bank group is accessed.

Referring to the aforementioned operation, if the first access time tCCDL varies, a pulse width of the control signal CTRL for accessing the same bank group may be adjusted to be correspondent with the first access time tCCDL. And, a pulse width of the write-in or read-out data may be adjusted to be correspondent with the first access time tCCDL which is variable.

As a result, the semiconductor memory device 100 according to example embodiments of may conduct a normal access operation to the same bank group even when there is an input of command in accordance with the first access time tCCDL, which may be variable. Therefore, access performance of the semiconductor memory device 100 may be improved.

Figure 10:
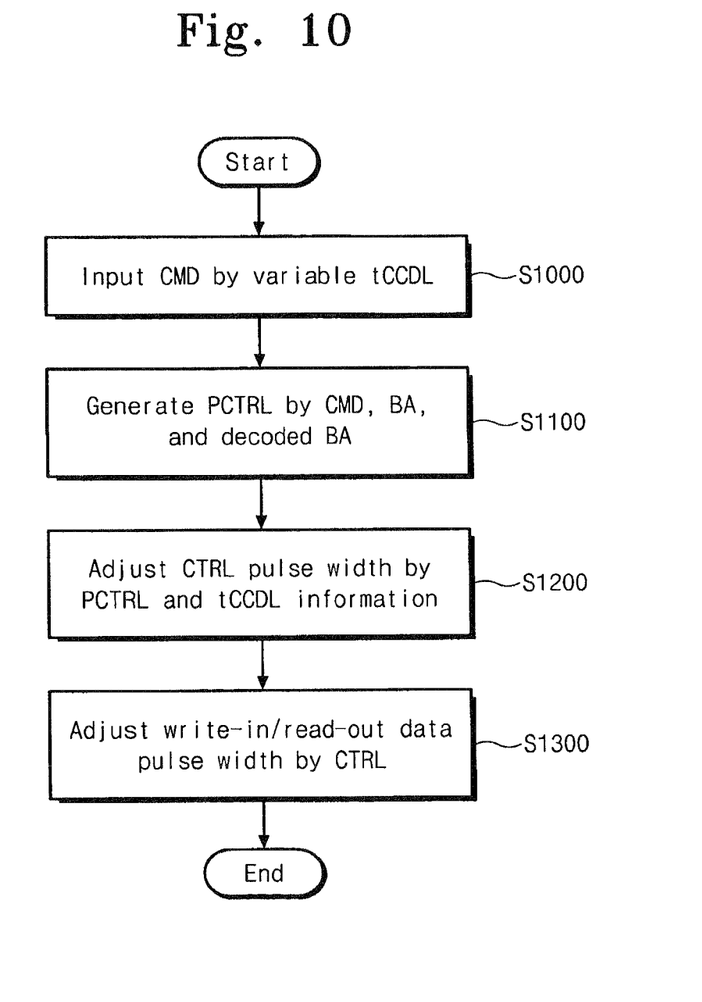
FIG. 10 is a flow chart showing an access operation method of the semiconductor memory device according to example embodiments.

FIG. 10 is a flow chart showing an access operation method of the semiconductor memory device according to example embodiments. Referring to FIG. 10, in operation S1000, the semiconductor memory device 100 may receive the address (ADD) and the command (CMD) in accordance with the first access time tCCDL, which may be variable. As is mentioned above, the address may include the bank address, the row address, and the column address. The first access time tCCDL may be equal to or longer than the second access time tCCDS. The first access time tCCDL may become longer as the operation frequency becomes higher. According to example embodiments, as the operation frequency increases, a clock period for accessing the same bank group may be extended. Information of the first access time may be stored in the MRS 170. If the first access time tCCDL is twice the second access time tCCDS, it may be permissible to accept a command for accessing another bank group before the command for accessing the same bank group. The command for accessing another bank group may be input in the period of the second access time tCCDS.

In operation S1100, a pre-control signal (PCTRL) may be generated in response to the command, the bank address, and the decoded address. In operation S1200, responding to the pre-control signal and the first access time information, a pulse width of the control signal may be adjusted to be correspondent with the first access time tCCDL, which may be variable. In operation S1300, responding to the control signal, a pulse width of the write-in or read-out data may be adjusted to be correspondent with the first access time tCCDL, which may be variable.

If the first access time tCCDL varies through this operation, a pulse width of the control signal for accessing the same bank group may be adjusted in correspondence with the first access time tCCDL. Further, a pulse width of the write-in or read-out data may be adjusted in correspondence with the first access time tCCDL, which may vary.

Consequently, the semiconductor memory device 100 according to example embodiments may conduct a normal access operation to the same bank group even when there is an input of command in accordance with the first access time tCCDL, which may be variable. Therefore, access performance of the semiconductor memory device 100 may be improved.

Through the description above, the semiconductor memory device and operation method thereof according to example embodiments may be practiced in conjunction with the first access time tCCDL for selecting the same bank group and the second access time tCCDS for selecting another bank group. But example embodiments may not be restrictive to the feature of using the first and second access times. Rather, example embodiments may be reduced by just using the access time tCCD.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

The invention claimed is:

1. A method of accessing memory banks in a cell array, comprising:
enabling a plurality of bank groups in a cell array, wherein each bank group includes at least two banks, and each bank includes a plurality of memory cells;
receiving a first command to access a first bank of a first bank group;
receiving a second command to access a first bank of a second bank group; and
receiving a third command to access a second bank of the first bank group,
wherein the third command is received after a first delay time,
the second command is received after a second delay time, and
wherein the first and second delay times are different.

2. The method of claim 1, wherein the first delay time is greater than the second delay time.

3. The method of claim 2, wherein the first delay time is three or more clock pulses.

4. The method of claim 1, wherein each of the first, second and third commands is a write command or a read command.

5. The method of claim 1, wherein the first, second or third command includes a column address strobe signal.

6. The method of claim 1, wherein enabling the plurality of bank groups comprises:
providing the first delay time to a control unit that receives the first to third commands, wherein the first delay time is stored in a mode register.

7. The method of claim 6, wherein the first delay time is stored in two bits of the mode register.

8. The method of claim 7, wherein the two bits are bit A10 and bit A11 of the mode register.

9. The method of claim 8, wherein the plurality of bank groups is enabled when the bit A11 is high.

10. The method of claim 1, further comprising:
disabling the plurality of bank groups;
receiving a fourth command to access the first bank of the first bank group;
receiving a fifth command to access the second bank of the first bank group;
receiving a sixth command to access the first bank of the second bank group; and
receiving a seventh command to access a second bank of the second bank group,
wherein the fifth command is received after a third delay time, the seventh command is received after a fourth delay time and the third and the fourth delay times are the same.

11. The method of claim 10, wherein the fourth to seventh commands are received in sequence.

12. The method of claim 10, wherein disabling the plurality of bank groups comprises:
providing the third delay time to a control unit that receives the fourth to seventh commands, wherein the third delay time is stored in bit A10 and bit A11 of a mode register and the plurality of bank groups is disabled in response the bit A11 being low.

13. The method of claim 1, wherein the cell array is included in a dynamic random access memory (DRAM).

14. The method of claim 13, wherein the DRAM includes a double data rate (DDR) synchronous DRAM.

15. The method of claim 1, wherein the second command is received between the first and third commands.

16. The method of claim 1, wherein the first, third and second commands are received in sequence.

17. The method of claim 1, wherein the first delay time is a command delay for accesses within the same bank group, and the second delay time is a command delay for accesses within different bank groups.

18. A method of accessing memory banks in a cell array, comprising:
enabling a plurality of bank groups in a cell array, wherein each bank group includes at least two banks, and each bank includes a plurality of memory cells;
receiving a first command to access a first bank of a first bank group;
receiving a second command to access a second bank of the first bank group; and
receiving a third command to access a first bank of a second bank group;
wherein the second command is received after a first delay time,
the third command is received after a second delay time,
the first and second delay times are different, and
wherein the first to third commands are received in sequence.

19. The method of claim 18, wherein the first delay time is longer than the second delay time.

20. The method of claim 18, wherein the first delay time is a command delay for accesses within the same bank group, and the second delay time is a command delay for accesses within different bank groups.

21. A method of accessing memory banks in a cell array, the cell array including a plurality of bank groups, wherein each bank group includes at least two banks, and each bank includes a plurality of memory cells, the method comprising:
receiving a first command to access a first bank of a first bank group of the bank groups;
receiving a second command to access a first bank of a second bank group of the bank groups; and
receiving a third command to access a second bank of the first bank group,
wherein the third command is received after a first delay time, the first delay time includes a first number of clock pulses,
the second command is received after a second delay time, the second delay time includes a second number of clock pulses, and
wherein the first and second number of clock pulses are different.

22. The method of claim 21, wherein the first to third commands are received in sequence.

23. The method of claim 21, wherein the first delay time has a greater number of clock pulses than the second delay time.

24. The method of claim 21, wherein the first, third and second commands are received in sequence.

* * * * *